United States Patent [19]

Fujino

[11] 4,450,586
[45] May 22, 1984

[54] AUTOMATIC TUNING DEVICE FOR FM RECEIVER

[75] Inventor: Shoji Fujino, Tokyo, Japan

[73] Assignee: Nippon Atsudenki Kabushiki Kaisha, Tokyo, Japan

[21] Appl. No.: 429,826

[22] Filed: Sep. 30, 1982

Related U.S. Application Data

[63] Continuation-in-part of Ser. No. 266,386, May 22, 1981, abandoned.

[30] Foreign Application Priority Data

May 26, 1980 [JP] Japan ................................ 55-72175

[51] Int. Cl.³ .............................................. H03J 7/18
[52] U.S. Cl. ................................... 455/161; 455/212; 455/194
[58] Field of Search ............... 455/161, 164, 165, 169, 455/194, 212, 222, 225

[56] References Cited

U.S. PATENT DOCUMENTS

| | | | |
|---|---|---|---|
| 3,560,858 | 2/1971 | Sakai et al. | 455/169 |
| 3,947,774 | 3/1976 | Glennon et al. | 455/169 |
| 4,245,348 | 1/1981 | Imazeki | 455/165 |
| 4,387,469 | 6/1983 | Miyazaki et al. | 455/161 |

*Primary Examiner*—Jin F. Ng
*Attorney, Agent, or Firm*—Barnes & Thornburg

[57] ABSTRACT

This invention relates to a FM receiver and more particularly to a FM receiver having an auto-scanning circuit. In a conventional FM receiver using an auto-scanning circuit, a window comparator is provided at the latter position of a demodulation circuit. When an electromagnetic wave is received, scanning is stopped by using the both of DC component of demodulation voltage generated within a specific range of frequencies around the tuning frequency and a squelch signal. In the present invention, in order to utilize stabilized parts of DC component of the demodulation voltage, as much as possible, except for the rising parts of the DC component, a timing circuit is provided which is switched on by the demodulated signal outputted from the window comparator continuing for a given time, thereby a perfect tuning is assured.

4 Claims, 6 Drawing Figures

AUTOMATIC TUNING DEVICE FOR FM RECEIVER

This is a continuation in part of Ser. No. 266,386 filed, May 22, 1981, now abandoned.

BACKGROUND OF THE INVENTION

Such a FM receiver has been known that automatic tuning to the broadcast wave is attained by provision of an auto-scanning circuit and a scanning-stop circuit. This conventional FM receiver has its constitution that the instruction to the scanning-stop circuit is issued solely as a squelch signal and that when the FM-receiver catches a broadcast wave and a squelch signal is issued, immediately the scanning-stop circuit acts on this squelch signal and a scanning-stop signal is issued to cease the scanning. In this type of FM receiver, there is no specific hindrance when the scanning is done with a scanning step wider than the receiver band width; but when the scanning is done with a scanning step narrower than the receiver band width, there is such a drawback that the scanning-stop circuit will come into action considerably before an exact tuning frequency is attained and in consequence, a perfect tuning will not be assured.

For the solution of the above-mentioned drawback, there is such a FM receiver that a window comparator is provided on the latter part of a demodulation circuit and an AND circuit is provided at the preceeding part of the scanning-stop circuit, whereby it is determined by using the window comparator whether or not a demodulation voltage is within the range of the reference voltage, and automatic tuning is conducted by using both of the demodulation voltage and the squelch signal. In this window comparator, a DC component of the demodulation voltage is utilized. The window comparator outputs demodulated signal towards the AND circuit when the DC component of the demodulation voltage falls in within the reference voltage. However, when the demodulated signal is inputted into the AND circuit as it is, the distinction is not made between the tuned one and no-tuned one. Therefore, there is such a problem that even though the tuning is not conducted, an output signal is issued from the AND circuit to the scanning-stop circuit; the scanning stop is carried out while the precise tuning is not attained, which renders the window comparator with the above-mentioned problem to be impracticable.

BRIEF SUMMARY OF THE INVENTION

The primary object of the present invention is to provide an automatic tuning device for a FM receiver which takes place at an instant of the broadcast wave being reliably captured, in the FM receiver with an auto-scanning circuit.

Still another object of the present invention is to provide an automatic tuning device available for an FM receiver with a built-in quadrature or differential peak detector.

Still another object of the present invention is to provide an automatic tuning device available for an FM receiver with a built-in crystal discriminator or ceramic discriminator or ratio detector.

DETAILED DESCRIPTION OF THE INVENTION

Figure 1:
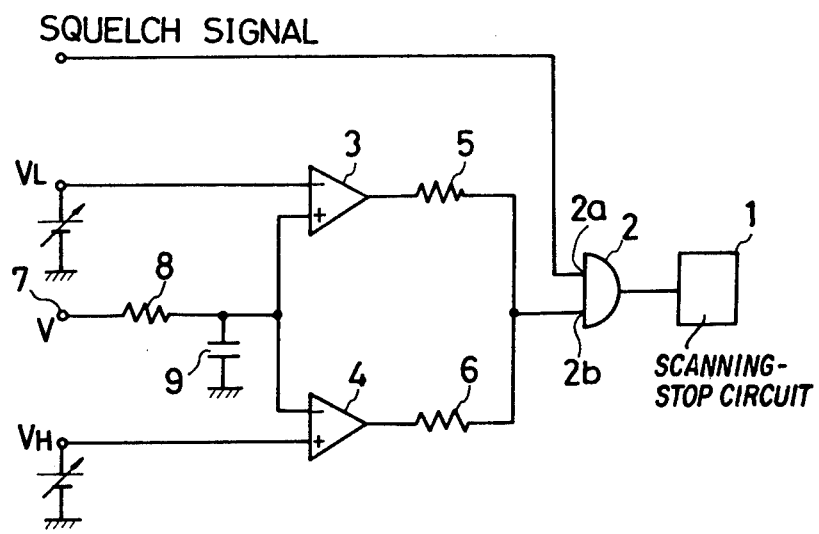
FIG. 1 is a view explaining an automatic tuning circuit of a conventional FM receiver.

FIG. 1 shows a circuit view showing a prior art of an automatic tuning device for a FM receiver concerning the present invention. In this Figure, 1 is a scanning-stop circuit and 2 is an AND circuit provided preceeding the scanning-stop circuit 1. The scanning-stop circuit 1 acts to output scanning-stop signal when it receives an output signal from the AND circuit 2.

The AND circuit 2 is provided with two input terminals 2a, 2b. The input terminal 2a receives a squelch signal from squelch circuit not shown here of auto-scanning circuit 40. To the input terminal 2b is inputted demodulated signal outputted from two comparators 3, 4 to be described later via resistances 5, 6. The two comparators 3, 4 constitute a window comparator.

Figure 2:
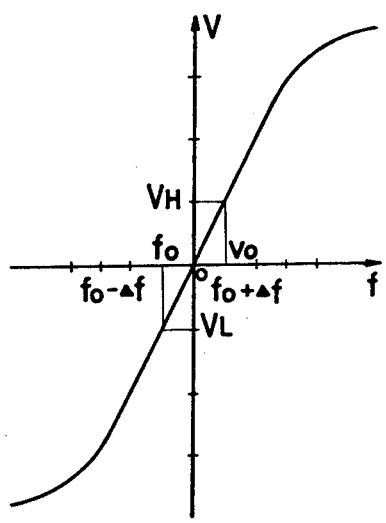
FIG. 2 is a diagram illustrating the tuning characteristic of an FM receiver.

Reference numeral 7 is an input terminal for the demodulation voltage, 8 is a resistance, and 9 is a condenser. The resistance 8 and the condensor 9 constitute an integrating circuit. This integrating circuit has a function to extracts a DC component of the demodulation voltage and input the DC component to the window comparator. The demodulation voltage is outputted from the demodulation circuit 42 and shows S-letter characteristic as shown in FIG. 2. In FIG. 2, f is a carrier frequency, V is a demodulation voltage $f_H$ is an upper limit of the carrier frequency, and $f_L$ is a lower limit of the carrier frequency. The carrier frequency has a constant band width at $f_H=f_O+\Delta f$ and $f_L=f_O-\Delta f$, in which $f_O$ is a center frequency of the carrier frequency and corresponds to a center frequency of the tuning frequency. The term $V_L$ shows the lower limit of the demodulation voltage, and $V_H$ does the upper limit of the latter.

Figure 6:
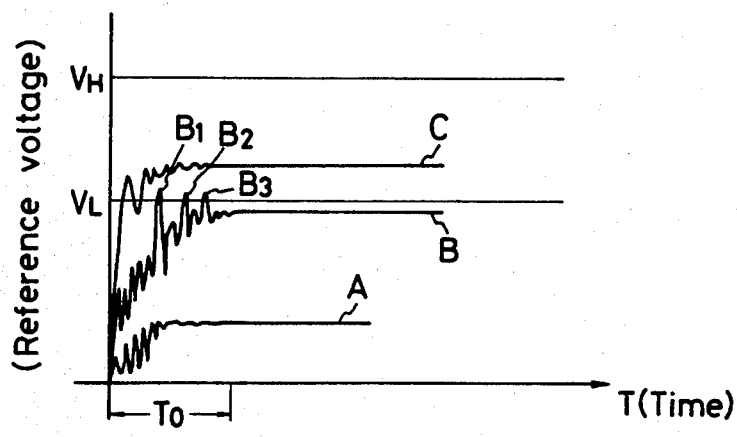
FIG. 6 is a characteristic view of a DC component of a demodulation voltage so as to explain the automatic tuning circuit of the FM receiver according to the present invention.

In the above-mentioned prior art, when there is a DC component of a demodulation voltage within the range of the reference voltage which is imparted to the window comparator, it immediately output demodulated signal to the AND circuit 2. As shown in A, B, C of FIG. 6, DC component of the demodulation voltage produces ripples from various sources such as noise; especially, ripples are mostly produced at the rising portion of the DC component. If the demodulated signal is inputted to the AND circuit 2 as it is, there is such a risk that the AND circuit 2 outputs an output signal which bring into action the scanning-stop circuit even in the case that the DC component of the demodulation voltage is stabilized and is out of the range of the reference voltage. Therefore, it results in the losing of the intention to stop the tuning by specially using the both of the demodulation voltage and the squelch signal.

Figure 3:
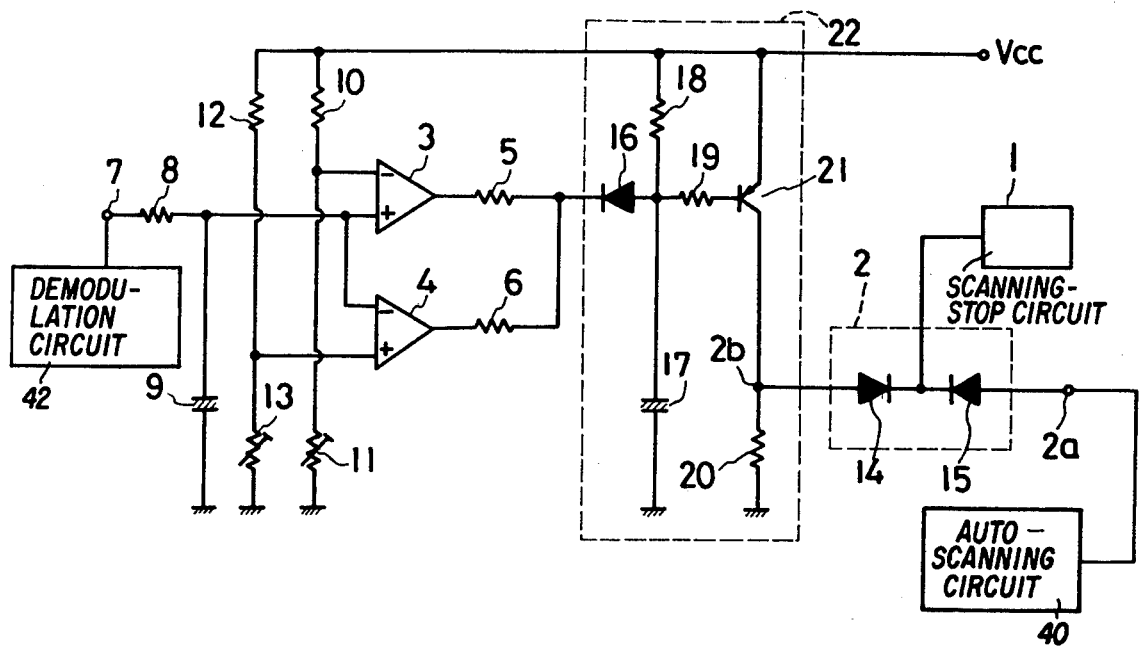
FIG. 3 is a circuit diagram of one embodiment of the automatic tuning circuit of the FM receiver according to the present invention.
Figure 4:
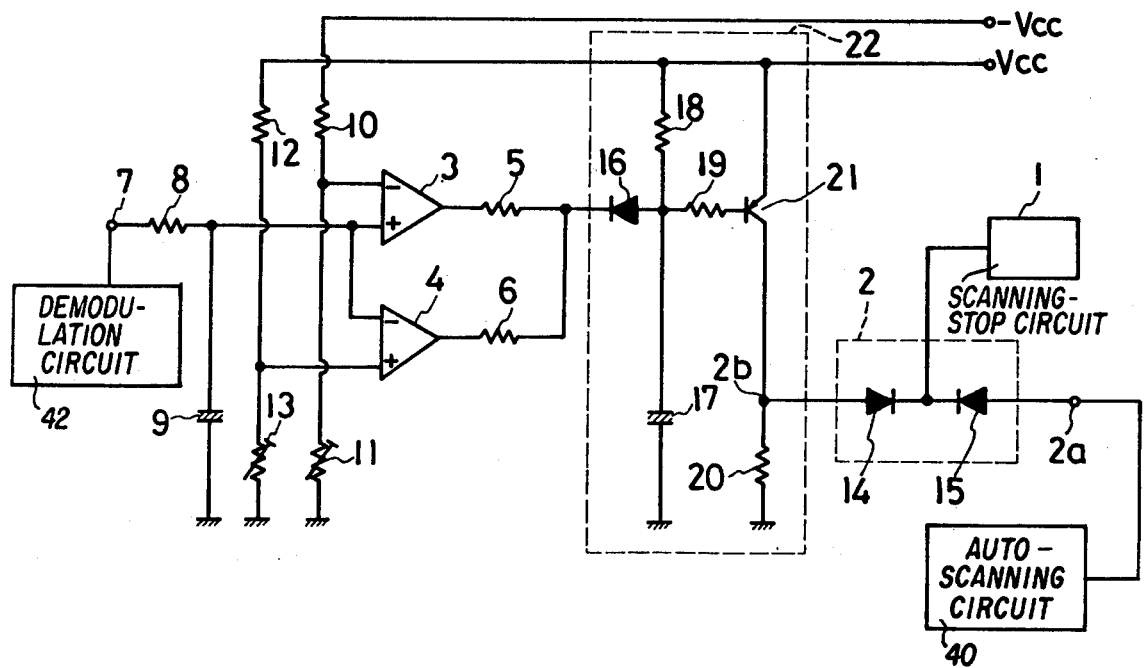
FIG. 4 is a circuit diagram of another embodiment of the automatic tuning circuit of the FM receiver according to the present invention.

FIGS. 3 and 4 show embodiments of the automatically tuning circuit of the FM receiver according to the present invention. FIG. 3 shows the embodiment that the FM receiver uses Quadrature Detector or Differential Peak Detector. FIG. 4 shows the embodiment that the FM receiver uses a crystal discriminator, a ceramic discriminator or a ratio detector.

Figure 5:
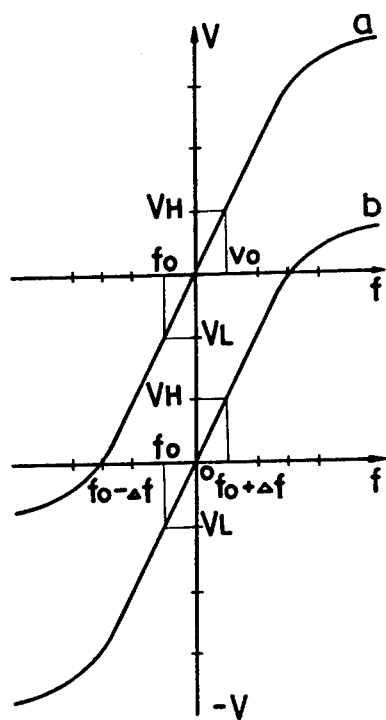
FIG. 5 is a diagram illustrating tuning performance of an FM receiver in the embodiments of FIGS. 3 and 4.

FIG. 5 shows a tuning characteristic of the FM receiver according to the present invention. In FIG. 5, a shows a tuning curve in a case that the FM receiver uses a Quadrature Detector or Differential Peak Detector, and b shows a tuning curve in a case that the FM receiver uses a crystal discriminator, a ceramic discriminator or a ratio detector.

In FIG. 3, the demodulation voltage from the demodulation circuit 42 is inputted to the input terminal 7. The demodulation voltage is integrated at the integrating circuit consisting of the resistance 8 and the condensor 9, and only the DC component thereof is extracted. The reference numerals 10, 11, 12 and 13 shows resistances. The resistances 10 and 11 are connected in series, and the resistances 12 and 13 are connected in series. The resistances 10 and 12 are respectively connected to the source voltage Vcc, and the resistances 11 and 13 are respectively grounded. The resistances 10 and 11 and the resistances 12 and 13 respectively constitute divider circuits so as to impart the reference voltage to the comparators 3 and 4. The resistances 11 and 13 are variable type and can adjust the reference voltage. In the present invention, positive reference voltages are used for the reference voltages and their values are made different from each other.

The AND circuit 2 is, here, constituted by using two diodes 14, 15. Respective diodes 14, 15 are connected as shown in FIG. 3 and output at active low. When the output signal inputted to the diode 14 is L and the output signal inputted to the diode 15 is L, the AND circuit 2 outputs the output signal to the scanning-stop circuit 1 to bring into action the scanning-stop circuit 1. In case an active high output is needed, two inverters have only to be introduced in the AND circuit 2 and the connection of the diodes 14, 15 has only to be reversed.

A timing circuit 22 is provided between the latter position of the window comparator and the preceeding position of the AND circuit 2. The timing circuit 22 is switched on by the demodulated signal outputted from the window comparator continuing for a given time. The timing circuit 22 consists of a diode 16, condenser 17, resistances 18, 19, 20, and transistor 21. The timing circuit 22 has a delay circuit and a switching circuit; the delay circuit is constituted of a diode 16, a resistance 18 and a condensor 17, and the switching circuit is constituted of a transistor 21 and resistances 19, 20. A demodulated signal from the window comparator is inputted to the diode 16. The resistance 18 and the condenser 17 are connected in series, and the resistance 18 is connected to the source voltage Vcc, and the condenser 17 is grounded. Electric charges accumulated in the condenser 17 flows towards the window comparator through the diode 16, when the demodulated signal is inputted to the diode 16. An emitter of the transistor 21 is connected to the source voltage Vcc. The collector of the transistor is connected to the ground via the resistance 20, and the base of the transistor is connected to the high electric potential side of the condenser 17. The high electric potential side of the resistance 20 is connected to the input terminal 2b. The delay circuit switches on the transistor 21 when the demodulated signal is inputted continuously for a given time. As shown in FIG. 2, it is most favorable for the delay circuit to switch on the transistor 21 after a given time To passes from the rising-starting point.

Next, it is explained the operation of the automatic tuning device for the FM receiver according to the present invention. (a) A case that a DC component of the demodulation voltage is a characteristic shown as the reference A:

In this case, the DC component of the demodulation voltage is out of the range of the reference voltages $V_L$, $V_H$, so that the window comparator does not output the demodulated signal and keeps the state of L. Accordingly, the condenser of the timing circuit 22 is retained in its electric potential and the transistor 21 is kept under "ON". Further, since source voltage is impressed to the input terminal 2b as it is and the input to the diode 14 becomes H, the AND circuit 2 does not output the output signal which bring into action the scanning-stop circuit 1, to the latter and the scanning movement is continued, even though the squelch signal is inputted to the input terminal 2b and the input to the diode 15 becomes L. (b) A case that a DC component of the demodulation voltage is a characteristic shown as the reference B:

In this case, among the rising portions of the DC component of the demodulation voltage, its parts $B_1$, $B_2$, $B_3$ fall within the range of the reference voltage. From the window comparator is issued demodulated signals during $B_1$, $B_2$ and $B_3$ being within said range, and the diode 16 is switched off. The condenser 17 is charged through the resistance 18. In response thereto, the electric charge of the condenser 17 increases and the electric potential of the condenser 17 rises. The electric potential of the condenser 17 does not rise up to the point that the electric potential switches off the transistor 21, and the source voltage is retained at the input terminal 26, whereby continuing the scanning movement. (c) A case that a DC component of the demodulation voltage is characteristic shown as the reference C:

In this case, the DC component of the demodulation voltage are stabilized and falls within the range of the reference voltage $V_L$, $V_H$ after a given time passes from the rising point. Accordingly, the demodulated signal is continuously inputted to the diode 16, resulting in switching off the diode 16. The condenser 17 is charged through the resistance 18. The electric potential of the condenser 17 rises up to the point to switch off the transistor 21. Then, the transistor 21 is switched off and the electric potential of the input terminal 2b is lowered, whereby the input to the diode 14 becomes L. In this case, when a squelch signal is inputted to the input terminal 2a and the input to the diode 15 becomes L, the AND circuit 2 outputs to the scanning-stop circuit 1 an output signal which bring into action the scanning-stop circuit 1, whereby stopping the scanning In FIG. 4, the impressing way of the reference voltage is varied so as to be available for a FM receiver. It is constituted like that a negative reference voltage is imparted to the comparator 3 and a positive reference voltage is imparted to the comparator 4. Since the other constitution is same as the above-mentioned embodiment, the detailed description therefor is omitted.

What is claimed is:

1. An automatic tuning device of a FM receiver comprising:
   an auto-scanning circuit for outputting a squelch signal,
   a scanning-stop circuit for outputting a tuning-stop signal, an integrating circuit, a demodulation circuit, means for coupling the demodulation circuit to the integrating circuit, the integrating circuit extracting a DC component from a demodulation signal outputted from the demodulation circuit, within a constant range around a tuning frequency, a window comparator and means for coupling the integrating circuit to the window comparator, the window comparator detecting whether or not the DC component is within the range to output the demodulated signal, a timing circuit and means for coupling the window comparator to the timing circuit, the timing circuit being switched on by the demodulated signal outputted from the window comparator being continued for a given time, and an AND circuit, means for coupling the scanning-stop circuit to the AND circuit, means for coupling the timing circuit to the AND circuit, and means for coupling the auto-scanning circuit to the AND circuit, the AND circuit outputting to the scanning-stop circuit an output signal which brings into action the scanning-stop circuit only when the timing circuit is switched on and the squelch signal is outputted.

2. The automatic tuning device of a FM receiver claimed in claim 1, wherein the window comparator is constituted by using two comparators, and to each one input terminal of each comparator is given a positive reference voltage, and the values of the reference voltages are made different from each other.

3. The automatic tuning device of a FM receiver claimed in claim 1, wherein the window comparator is constituted by using two comparators, and to one input terminal of one of the two comparators is given a positive reference voltage, and to one input terminal of the other of the comparators is given a negative reference voltage.

4. The automatic tuning device of a FM receiver claimed in claim 1, wherein the timing circuit is provided with a transistor for switching which outputs an output signal toward the AND circuit and a delay circuit for on-off controlling the transistor for switching, a demodulated signal being inputted to the delay circuit.

* * * * *